United States Patent
Sicurella et al.

(10) Patent No.: US 11,101,813 B2
(45) Date of Patent: Aug. 24, 2021

(54) MULTIPLE INPUT ANALOG-TO-DIGITAL CONVERTER DEVICE AND CORRESPONDING METHOD

(71) Applicant: STMicroelectronics S.r.l., Agrate Brianza (IT)

(72) Inventors: Giovanni Sicurella, Catania (IT); Manuela La Rosa, Gravina di Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/993,608

(22) Filed: Aug. 14, 2020

(65) Prior Publication Data

US 2021/0050859 A1 Feb. 18, 2021

(30) Foreign Application Priority Data

Aug. 16, 2019 (IT) .......................... 102019000014826

(51) Int. Cl.
| | | |
|---|---|---|
| *H03M 1/12* | (2006.01) | |
| *G04F 10/00* | (2006.01) | |
| *H03K 3/03* | (2006.01) | |
| *H03M 1/16* | (2006.01) | |
| *H03M 1/50* | (2006.01) | |

(52) U.S. Cl.
CPC .......... *H03M 1/123* (2013.01); *G04F 10/005* (2013.01); *H03K 3/0315* (2013.01); *H03M 1/167* (2013.01); *H03M 1/502* (2013.01)

(58) Field of Classification Search
CPC ...... H03M 1/123; H03M 1/502; H03M 1/167; G04F 10/005; H03K 3/0315
See application file for complete search history.

(56) References Cited

U.S. PATENT DOCUMENTS

| | | | |
|---|---|---|---|
| 8,451,156 B2 * | 5/2013 | Daniels ............... | H03M 1/1265 341/143 |
| 8,957,712 B2 * | 2/2015 | Tang ...................... | H03M 1/50 327/159 |
| 9,007,133 B2 | 4/2015 | Cremonesi et al. | |
| 9,529,336 B2 * | 12/2016 | Liu .......................... | H03M 1/34 |

(Continued)

FOREIGN PATENT DOCUMENTS

WO 2008050177 A1 5/2008

OTHER PUBLICATIONS

Weihan Hu: "A 9-bit 33MHz Hybrid SAR Single-slope ADC", Dec. 8, 2015, XP055696757 (69 pages).

(Continued)

*Primary Examiner* — Brian K Young
(74) *Attorney, Agent, or Firm* — Crowe & Dunlevy (57) ABSTRACT

A multiple-input analog-to-digital converter device includes analog-to-digital converter circuits arranged between input nodes and output nodes. The analog-to-digital converter circuits operate over respective conversion times to provide simultaneous conversion of the analog input signals into respective conversion time signals. A time-to-digital converter circuit includes timer circuitry common to the plurality of analog-to-digital converter circuits. The timer circuitry cooperates with the analog-to-digital converter circuits to convert the conversion time signals into digital output signals at the output nodes.

13 Claims, 9 Drawing Sheets

(56) References Cited

U.S. PATENT DOCUMENTS

| | | |
|---|---|---|
| 10,623,010 B2 * | 4/2020 | Loke .................. H03M 1/183 |
| 2013/0063295 A1 | 3/2013 | Hagihara |
| 2016/0246262 A1 | 8/2016 | Liu et al. |
| 2019/0372579 A1 | 12/2019 | La Rosa et al. |

OTHER PUBLICATIONS

IT Search Report and Written Opinion for IT Appl. No. 102019000014826 dated May 19, 2020 (10 pages).

\* cited by examiner

MULTIPLE INPUT ANALOG-TO-DIGITAL CONVERTER DEVICE AND CORRESPONDING METHOD

PRIORITY CLAIM

This application claims the priority benefit of Italian Application for Patent No. 102019000014826, filed on Aug. 16, 2019, the content of which is hereby incorporated by reference in its entirety to the maximum extent allowable by law.

TECHNICAL FIELD

The description relates to analog-to-digital converters (ADCs).

One or more embodiments may apply, for instance, in digital control loops.

BACKGROUND

A wide variety of devices use analog-to-digital converters; those devices that include digital control loops are exemplary of these. Performance of such converters may thus play a significant role in operation of such devices.

Certain applications may involve simultaneous conversion of plural input signals, that is plural analog signals being converted to digital over time intervals which are at least partly superposed.

A conventional approach to simultaneous analog-to-digital conversion of plural signals involves using a number of analog-to-digital conversion circuits or blocks equal to the number of inputs.

Circuits referred to as time-to-digital converters (TDCs) are conventionally used to measure a time period and convert it into a digital number.

Certain TDC arrangements may use internal propagation delays of signals through logical gates to measure time intervals with high precision. Such measuring units may be triggered by a start signal and stopped by a stop signal. The time interval between start and stop may be calculated (for instance with a 20-bit measurement range) based on the position reached by a ring oscillator including a plurality of such logical gates. In these arrangements the measurement range may be linked to the size of the counter.

There is a need in the art to contribute in further developments of multiple-input analog-to-digital converters (ADCs).

SUMMARY

One or more embodiments relate to a device.

One or more embodiments may relate to a corresponding method by which the device operates.

In one or more embodiments, a same single time-to-digital converter (TDC) may be used for multiple and simultaneous ADC conversions.

One or more embodiments may reduce mismatch due to process variations and control loop timing.

One or more embodiments may facilitate achieving a reduced semiconductor area.

One or more embodiments may provide an improved architecture for multiple simultaneous analog-to-digital conversion in an integrated solution reducing area occupation and process-dependent inconsistency.

One or more embodiments may adopt, as a time counter for conversion, a time-to-digital converter (TDC) based on a ring oscillator with an even number of delay units.

BRIEF DESCRIPTION OF THE DRAWINGS

One or more embodiments will now be described, by way of example only, with reference to the annexed figures, wherein.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
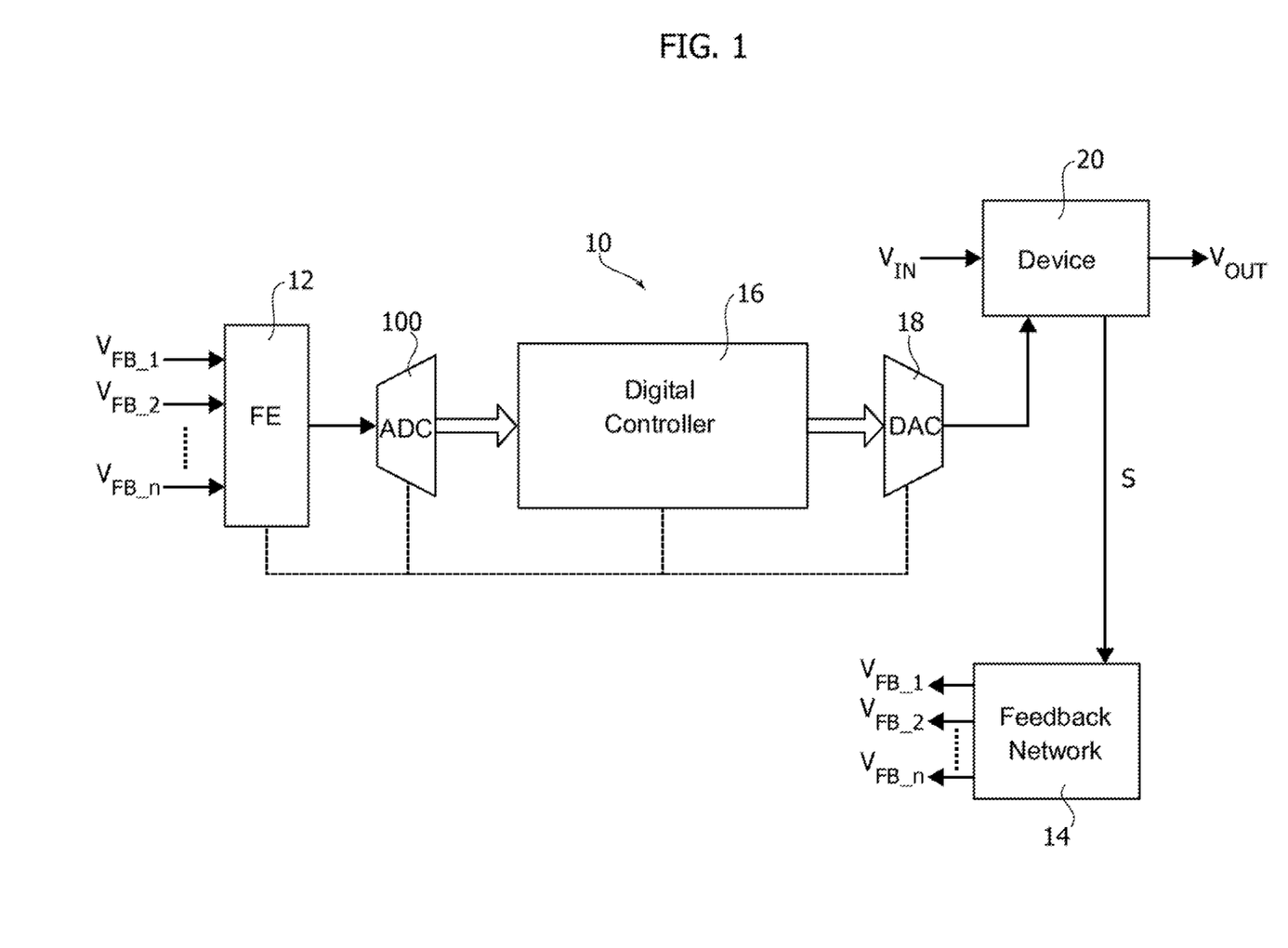
FIG. 1 is a block diagram exemplary of a possible context of use of embodiments.

FIG. 1 is an exemplary representation of a possible context of use of a (multiple-input) analog-to-digital converter (ADC).

The exemplary system illustrated in FIG. 1, indicated as 10 overall, may include an input interface (front end—FE) 12 configured to receive a plurality of input signals $V_{FB\_1}$ $V_{FB\_2}, \ldots, V_{FB\_n}$ from a feedback network 14 as discussed in the following.

As exemplified in FIG. 1, the interface/front end circuit 12 is configured to process the signals $V_{FB\_1}, V_{FB\_2}, \ldots, V_{FB\_n}$ (conditioning, level shifting, and so on, for instance) and to apply these to an analog-to-digital converter (ADC) 100 which in turn generates digital versions of the signals received as an input to be applied as input data to a digital controller 16. The digital controller 16 is configured to perform a certain control action, such as (merely by way of example) controlling a certain voltage and a certain current in view of reference voltage value and a current limit value.

As exemplified in FIG. 1, the (digital) output from the digital controller 16 is supplied to a digital-to-analog converter (DAC) 18 to generate one or more control signals which are in turn applied to a controlled device 20 (a power device, for instance) which receives a certain input voltage $V_{IN}$ and provides an output voltage $V_{OUT}$.

As exemplified in FIG. 1, the device 20 generates one or more sensing signals S which are supplied to the feedback network 14 mentioned in the foregoing.

The feedback network 14 produces the feedback signals $V_{FB\_1}, V_{FB\_2}, \ldots, V_{FB\_n}$ which are provided as a feedback signals to the interface/front end 12 discussed in the foregoing.

It will be otherwise appreciated that the arrangement of FIG. 1 is merely exemplary of a wide class of systems where simultaneous conversion of plural input signals ($V_{FB\_1}, V_{FB\_2}, \ldots, V_{FB\_n}$) from analog to digital may be involved.

Reference to a system 10 as exemplified in FIG. 1 (which may be exemplary of a digital control loop of, say, an electric motor in the automotive sector) is merely exemplary and not intended to be construed, even indirectly, as limiting the embodiments.

Analog-to-digital converters (ADC) 100 and digital-to-analog converters (DAC) 18 as exemplified in FIG. 1 may be implemented as separated blocks of a control architecture.

Analog-to-digital converters (ADC) 100 and digital-to-analog converters (DAC) 18 as exemplified in FIG. 1 are broadly used in electronic control loops and their performance, in terms of space and efficiency, for instance may play a significant role.

Figure 2:
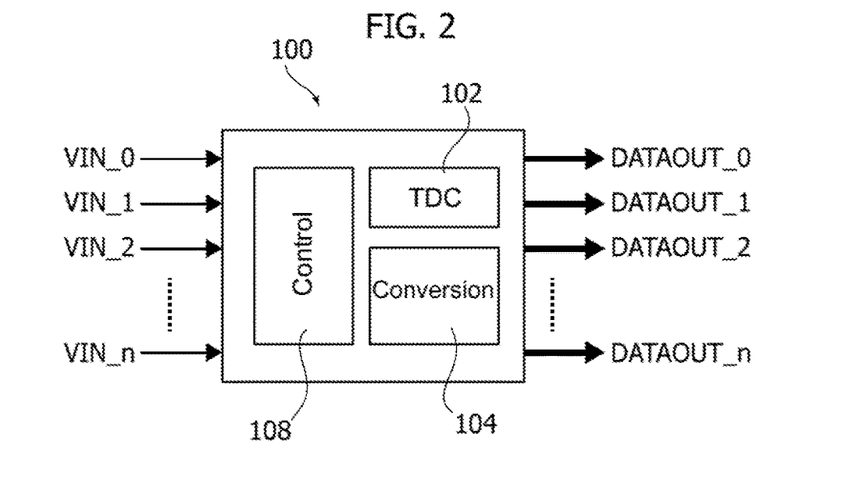
FIG. 2 is an exemplary functional block representation of embodiments.

The block diagram of FIG. 2 is exemplary of a possible embodiment of an analog-to-digital converter 100 in a context as exemplified in FIG. 1, namely a context where a simultaneous conversion of a plurality of analog signals $V_{FB\_1}, V_{FB\_2}, \ldots, V_{FB\_n}$ into digital signals DATAOUT_0, DATAOUT_1, ..., DATAOUT_n is desirable.

Throughout this description it will be assumed that the value for n can be selected as desired. Also (as already discussed) referring to "simultaneous" analog-to-digital conversion of signals will not limit embodiments to those embodiments where actual conversion takes place over intervals that correspond exactly with one another.

As illustrated in FIG. 2, an analog-to-digital circuit 100 according to embodiments as exemplified herein may comprise a (single) time-to-digital converter (hereinafter, briefly TDC) 102 cooperating with a plurality of conversion blocks (for instance, ramp generators, as discussed in the following) designated 104 as a whole under the control of a (digital) control circuit 108.

TDCs using internal propagation delays of signals through gates in a ring oscillator to measure time intervals with high precision are known, where a measuring unit is triggered by a START signal and stopped by a STOP signal. Based on the position of the ring oscillator and a coarse count, the time interval between START and STOP can be calculated with an N-bit measurement range.

Advantageously, one or more embodiments may include a TDC circuit 102 based on the solution disclosed in U.S. Pat. No. 9,007,133B2 (incorporated by reference).

An exemplary functional diagram of such a TDC 102 will first be considered by way of simplicity and ease of explanation.

Figure 3:
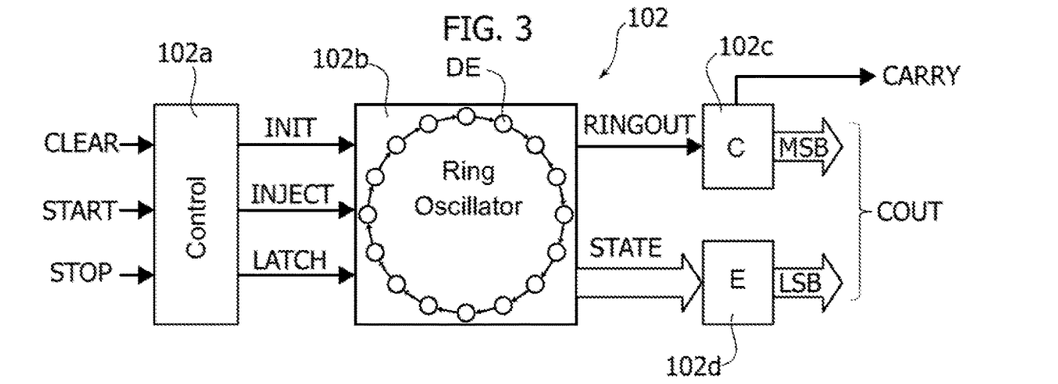
FIG. 3 is an exemplary functional diagram of a component which may be used in embodiments.

Briefly, as schematically represented in FIG. 3, such a TDC circuit 102 may comprise a control block 102a configured to provide initializing, injection and latch signals INIT, INJECT, LATCH as a function of start and stop signals START, STOP, with the capability of being cleared via a clear signal CLEAR.

While shown as a distinct entity for ease of explanation, the control block 102a may be incorporated to the control block 108, for instance.

As schematically represented in FIG. 3, the TDC circuit 102 may comprise a ring oscillator circuit 102b configured to be controlled via the signals INIT, INJECT, LATCH and provide output signals RINGOUT and STATE to an asynchronous counter (C) 102c (4-bit, for instance) and an encoder (E) 102d (4 bit, for instance) configured to produce the most significant bits (denoted MSB) and the least significant bits (denoted LSB), respectively, of an output time count signal COUT.

Also in view of the discussion provided in the following, those of skill in the art will appreciate that representing the blocks 102c and 102d as distinct blocks in FIG. 3 is primarily for the sake of explanation and does not correspond to a mandatory feature of embodiments.

Assuming, merely by way of example, that 8-bit output data words are desired for DATAOUT_0, DATAOUT_1, ..., DATAOUT_n (see FIG. 2):
- the signal RINGOUT may be a clock frequency signal for the 4-bit asynchronous counter 102c which will provide the most significant bits MSB,
- the four least significant bits LSB of the fractional time count will be generated by encoding of the 16 states of the ring oscillator 102b for instance by means of the 4-bit encoder block 102d as discussed in the following.

A carry signal CARRY, generated by the 4-bit asynchronous counter 102c may facilitate enlarging the maximum time count via the possible use of a higher-level (coarse) external synchronous counter: in the following a single counter 102c covering both possibilities will be considered for simplicity.

Figure 4:
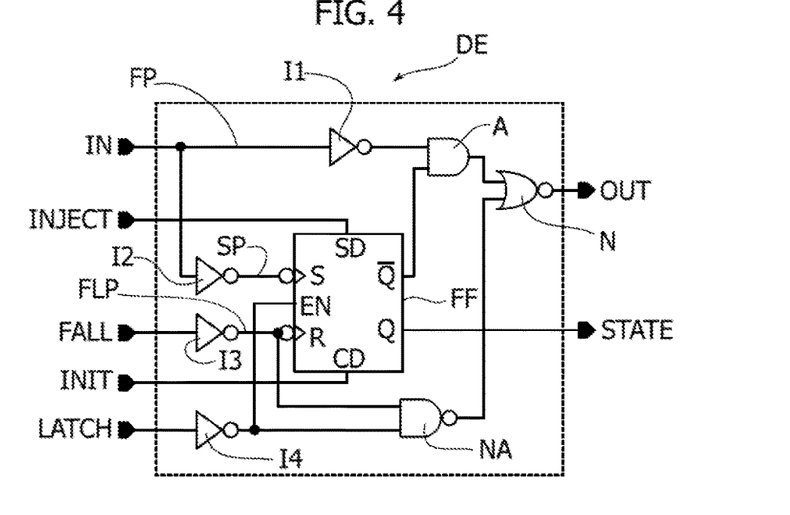
FIG. 4 is an exemplary circuit diagram of a part of the component as exemplified in FIG. 3.

In one or more embodiments, the ring oscillator 102b may comprise a set of delay elements DE as exemplified in FIG. 4 in a ring-like arrangement (loop) as discussed in U.S. Pat. No. 9,007,133B2.

While referring to U.S. Pat. No. 9,007,133B2 for a more detailed description, for the purposes herein it will suffice to recall that one or more embodiments may include a plurality of delay elements DE as exemplified in FIG. 4 in a ring-like arrangement (loop) of the kind exemplified in FIG. 5 (where certain ones of the signals represented in FIG. 4 are not expressly indicated for simplicity).

In a possible embodiment as exemplified herein, a positive edge of an input signal IN will cross a delay element DE as exemplified in FIG. 4 from input IN to output OUT through two different paths:
- a "fast" path FP through a first inverter I1, an AND gate A and a NOR gate N, having a (very) quick time propagation delay (Td, which will be further discussed in the following) related to time resolution of the TDC, and
- a "slow" path SP through a second inverter I2, the S to Q(neg) path through a flip-flop FF, the AND gate A and the NOR gate N, setting the state of the delay element DE at a Q output of the flip-flop FF, for instance.

As exemplified herein, the flip-flop FF may comprise a Dual D-Type Flip-Flop having:
- set and clear inputs SD and CD receiving the INJECT signal and INIT signal, respectively,
- an R input coupled to a fall path FLP from an input FALL via a third inverter I3,
- an enable input EN coupled to a latch path from an input LATCH via a fourth inverter I4.

As exemplified in FIG. 4, the outputs from the inverters I3 and I4 are (also) applied as inputs to a NAND gate NA whose output is applied as a second input to the NOR gate N which receives the output from the AND gate A as its other input.

In an arrangement as exemplified in FIG. 4, the DE state will remain high until a reset comes from the FALL input. The LATCH signal disables the input wave propagation and freezes the DE state.

Figure 5:
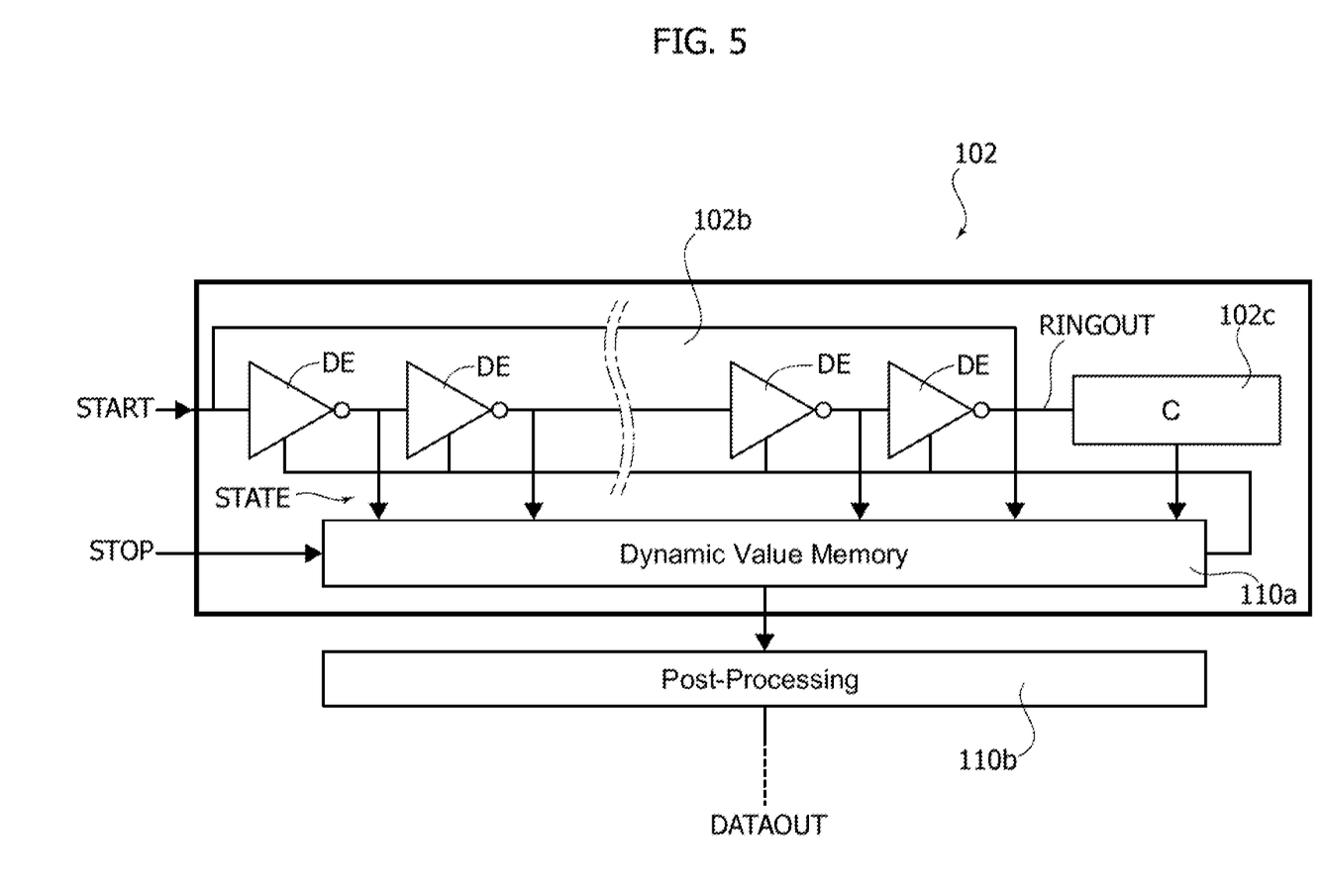
FIG. 5 is exemplary of a possible embodiment of the component as exemplified in FIG. 3 using parts as exemplified in FIG. 4.
Figure 6:
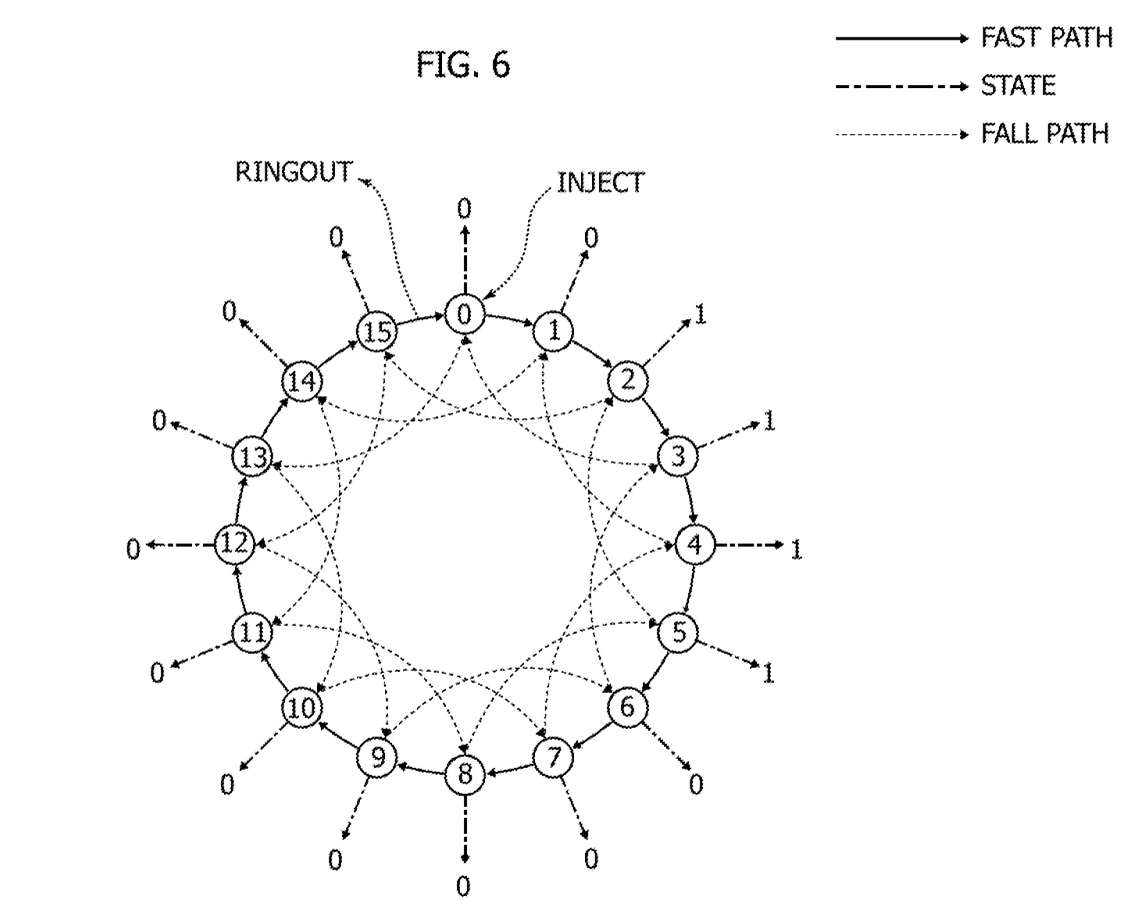
FIG. 6 is a diagram exemplary of possible operation of the component as exemplified in FIG. 3.

The state diagram of FIG. 6 is exemplary of possible connections of 16 (sixteen) delay elements such as DE in FIG. 4 in a ring-like arrangement as exemplified in FIG. 5.

The state diagram of FIG. 6 is thus under the assumption that the output OUT of each delay element DE is coupled to the input IN of a next (subsequent) delay element DE in a ring-like (loop) arrangement as exemplified in FIG. 5 where (see, for instance, U.S. Pat. No. 9,007,133B2) the output OUT from each delay element DE also supplied to the FALL input of a previous DE delay element arranged a certain number of positions (three positions, for instance) "upstream" in a ring-like (loop) arrangement.

This will result in an oscillating wave running through the ring with a period of sixteen times the "quick time" propagation delay Td, with the feedback to the FALL input of a previous delay element DE causing the respective state to be set high for a duration of four times Td.

When the INIT signal goes high, both the STATE and OUT nodes at the output of each delay element DE are set low. As a result of the CLEAR signal being applied, the control block 102a will send the INIT signal to each delay element DE in order to reset the state of the ring oscillator state.

As a result of the START signal being applied (which, as exemplified in FIG. 5, may occur to the input of the "number 0" delay element DE, that is, the first delay element DE in the ring arrangement) a time count will be enabled with the ring oscillator swinging.

For instance, the oscillation may be injected into the ring by setting high one of the sixteen INJECT inputs (for example the one of the "number 0" delay element DE). The index of the DE enabled to catch the INJECT signal can, however, be selected through a 4 bit digital word (CIN).

As a result of the ring oscillator swinging, the pulse wave propagating through the ring will return back to the starting element. After a complete round, a RINGOUT signal (from the last delay element DE in the ring arrangement) will go high, with the count of RINGOUT rising edges suited to provide via the counter 102c the MSB part (4-bit, for example) of the total time count COUT.

When a STOP signal rises, the LATCH signal will be enabled interrupting the oscillation and freezing the states of the delay elements DE, with the related information, collectively designated STATE stored in a dynamic value memory (designated 110a for reference to a possible implementation as discussed in the following in connection with FIG. 11).

Figure 7:
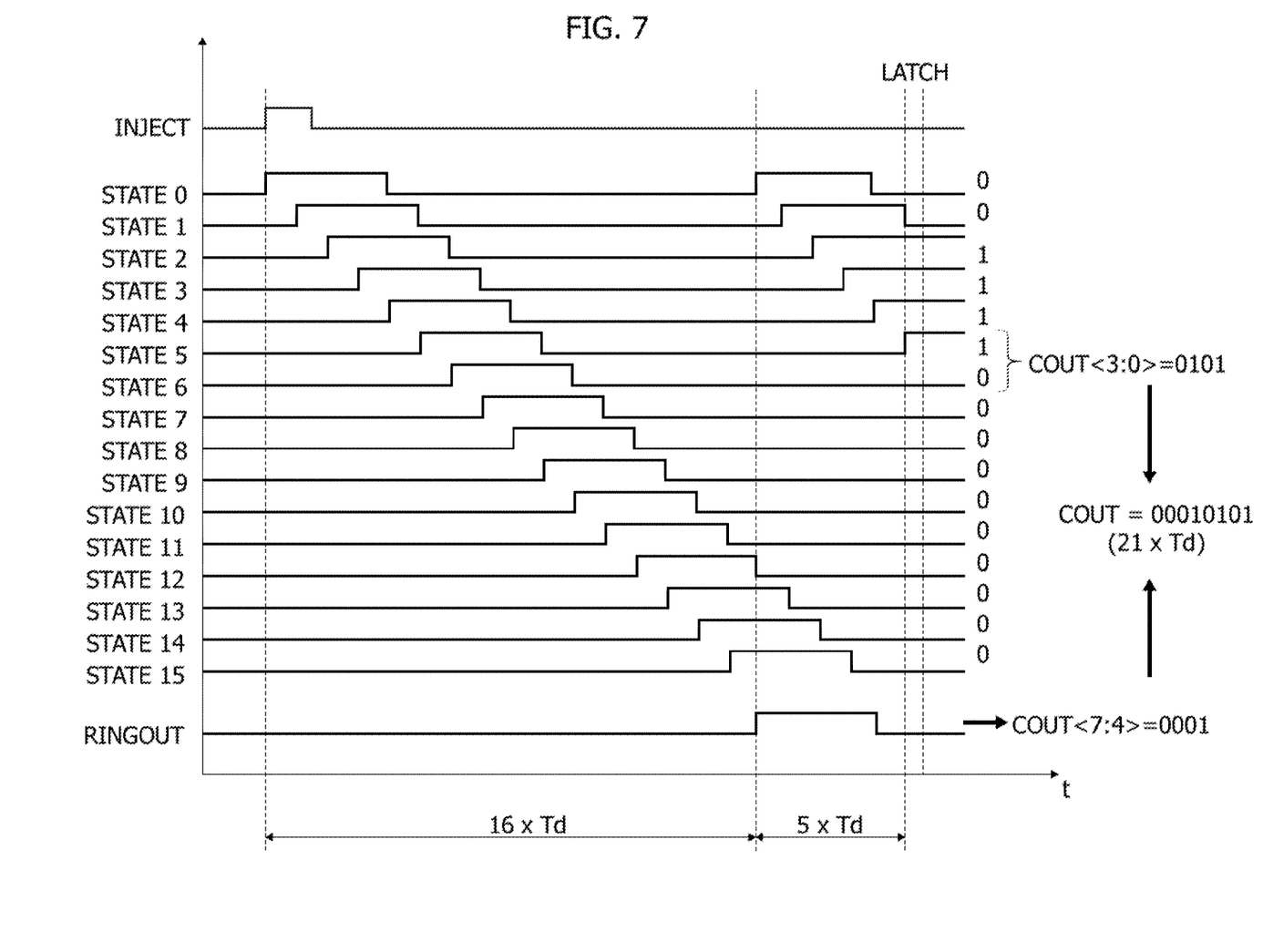
FIG. 7 is a time diagram exemplary of the possible time behavior of signals resulting from operation as exemplified in FIG. 6.

FIG. 7 is an exemplary representation over a common time scale t of a possible behavior of the states of delay elements DE in a ring oscillator 102b as a result of an oscillation being injected into the ring oscillator and stopped after the LATCH signal goes high. Sixteen states from STATE 0 to STATE 15 are shown herein having regard to the possible—non mandatory—provision of an (even) number of delay elements DE equal to 16.

Once the state is stable, data post-processing in a block designated 110b (for reference to a possible implementation as discussed in the following in connection with FIG. 11) will convert that STATE information to the MSBs of the (fractional) time count COUT used, together with the LSBs from the counter 102c to produce digitally converted output values DATAOUT (namely DATAOUT_0, DATAOUT_1, . . . , DATAOUT_n).

Such data post-processing can be performed in any manner known to those of skill in the art for that purpose. For instance, conversion can be performed by searching for two consecutive delay elements DE in the ring arrangement whose states achieve, say, a 1-to-0 transition (the delay elements DE to which STATE 5 and STATE 6 apply in FIG. 7 may be exemplary of these.

In this case, the four LSB may be 0101 meaning that the ring oscillator wave has been stopped at the sixth delay element DE from the starting one, obtaining a fractional time count of five times Td.

The entire COUT output (that is, the MSBs from 102c and the LSB from 102d on the right-hand side of FIG. 3) shows a total time count of, for instance, 21 times Td.

In one or more embodiments, a dedicated trimming circuit may be provided (as an embedded circuit, for instance, not visible in the figures) in order to tune the time delay of each delay element DE. For instance, using four bits for each delay element DE will facilitate modifying the delay of each element in the fast path FP (see FIG. 4) and adjust it as desired.

As discussed, one or more embodiments may provide an integrated solution for multiple-input synchronous analog-to-digital conversion where a same (single) TDC such as 102 can be used as time counter for a plurality of analog-to-digital conversion blocks, which facilitates reducing silicon area.

Figure 8:
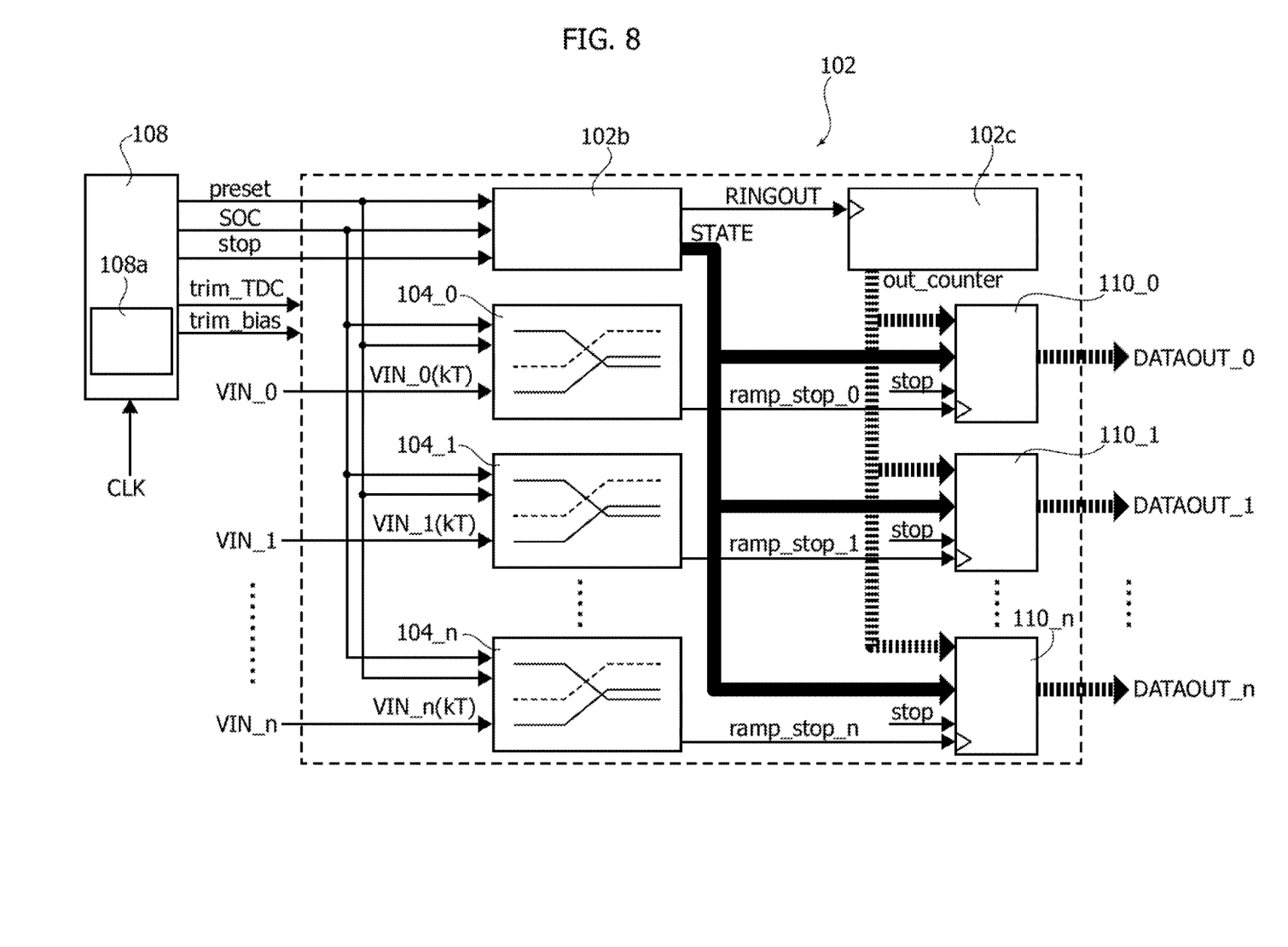
FIG. 8 is block diagram of exemplary embodiments.

A system as exemplified in FIG. 8 is able, simultaneously, to convert each one of a plurality of analog input (voltage) signals VIN_0 to VIN_n into a corresponding output digital word DATAOUT_0 to DATAOUT_n.

In one or more embodiments, a corresponding architecture as exemplified in FIGS. 2 and 8 may be based on three main blocks: the digital control block 108, the TDC-based time counter 102 and a matrix 104 of converters (ramp generators, for instance) 104_0, 104_1, . . . , 104_n.

In one or more embodiments, a digital control block 108 as shown on the left-hand side of FIG. 8 may comprise a digital control circuit that generates a time sequence, synchronized with a system clock signal CLK for use by the (plural) converter blocks 104_0, 104_1, . . . , 104_n and the (single, that is, one for all the converters blocks) time counter 102.

In one or more embodiments, a signal (designated preset in FIG. 8) from the control block 108 may initialize both the TDC-based time counter 102 and the converters (such as double ramp generators) 104_0, 104_1, . . . , 104_n. Also, a start-of-conversion signal (designated SOC in FIG. 8) from the control block 108 may start at the same time both the time counter 102 (that is, with SOC playing the role of START in FIG. 5—and the converters 104_0, 104_1, . . . , 104_n).

By way of direct comparison with FIG. 3, it will be appreciated that, for the sake of simplicity, in FIG. 8 the TDC-based time counter 102 is represented as including only the ring oscillator 102b and a counter 102c (which in FIG. 8 will be assumed to include both the 4-bit asynchronous counter of FIG. 3 and a course synchronous counter possibly associated therewith).

In various embodiments, the digital control block 108 may also include a calibration sub-block 108a configured to provide the calibration data trim_TDC to the time-to-digital conversion circuit 102 and/or calibration data trim bias to the converters 104_0, 104_1, . . . , 104_n (ramp generators, for instance, which may have configurable ramp slopes). Calibration, which may be performed manually or automatically, may involve varying signals trim_TDC and/or trim bias in order to synchronize the operation of the timer 102 with the ramp generators 104_0, 104_1, . . . , 104_n.

As discussed, in one or more embodiments, the time counter 102 may comprise a ring oscillator as discussed previously, which facilitates providing a "fine" time period counting (with a synchronous coarse counter possibly introduced in order to enlarge the time conversion range).

As exemplified herein, each ramp converter 104_0, 104_1, . . . , 104_n receives a respective analog input signal VIN_0, VIN_1, . . . , VIN_n to be converted into a digital word DATAOUT_0, DATAOUT_1, . . . , DATAOUT_n.

Various types of analog-to-digital conversion units known to those of skill in the art may be used in embodiments for that purpose.

For instance, as known to those of skill in the art (and as discussed in the following), converting the analog input signal VIN_0, VIN_1, . . . , VIN_n into digital signals or words may involve an act of sample-and-hold (S/H) processing of respective time-continuous analog signals as performed by corresponding S/H circuits (such as the blocks 1056 and 1058 discussed in the following in connection with FIG. 9).

Advantageously, the converters units 104_0, 104_1, . . . , 104_n (indicated as a whole as 104) may comprise (double) ramp generators as discussed in United States Patent Application Publication No. 2019/0372579 (incorporated by reference).

Figure 9:
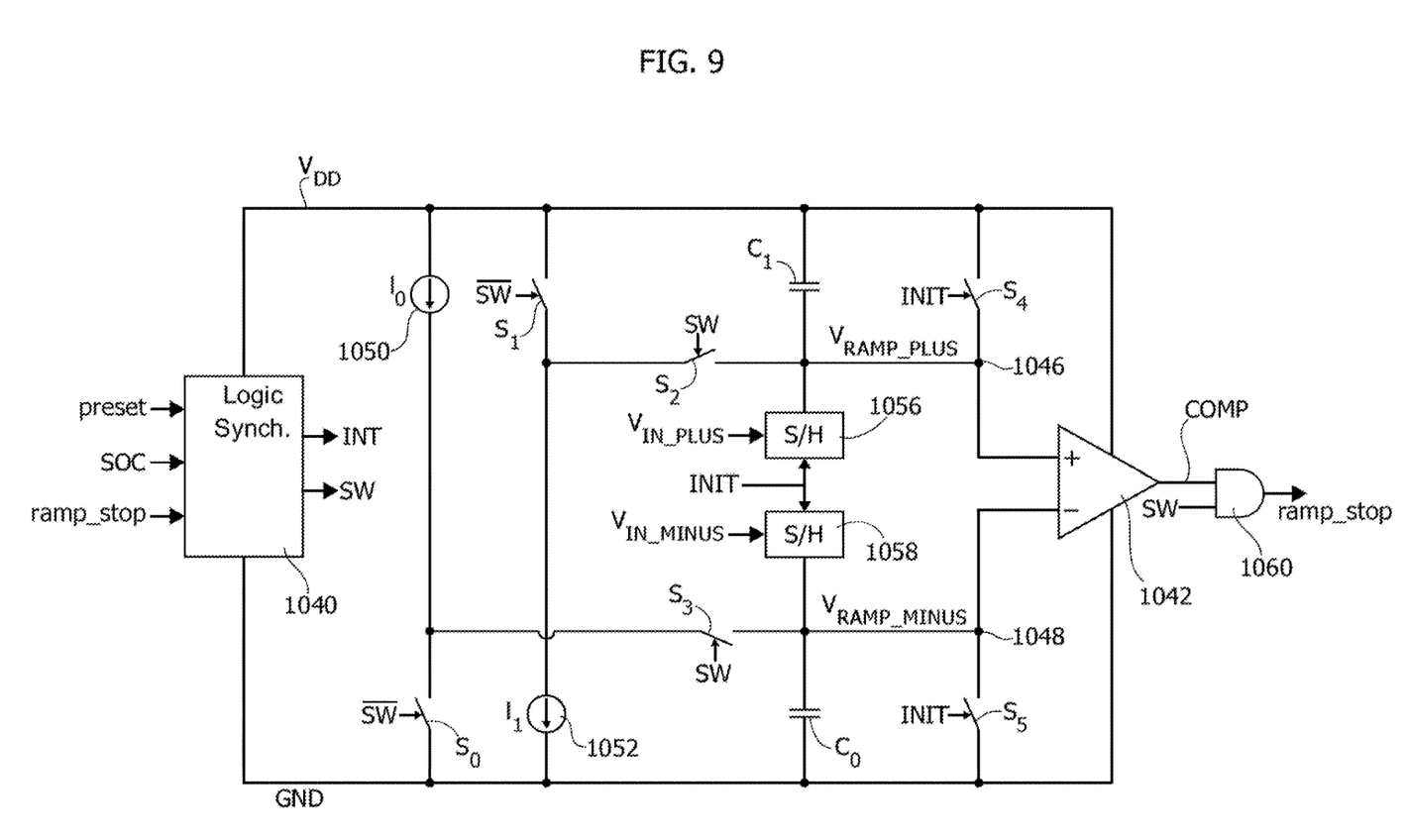
FIG. 9 is an exemplary circuit diagram of a part of the block diagram of FIG. 8.

A possible circuit diagram for such a ramp generator, indicated generally as 104_j is exemplified in FIG. 9.

In the exemplary embodiment considered herein, the ramp generator 104_j comprises a double ramp generator configured to generate a first ramp voltage signal $V_{RAMP\_PLUS}$ at a node 1046 and a second ramp voltage signal $V_{RAMP\_MINUS}$ at a node 1048.

In the exemplary embodiment considered herein, the ramp generator 104_j operates with differential voltages, that is with the (analog) input voltages to be converted VIN_j (j=0, . . . , n) applied differentially between the sample-and-hold (S&H) blocks 1056 and 1058 as VIN=$V_{IN\_PLUS}$-$V_{IN\_MINUS}$: in the following, the index j will be dropped for simplicity, by assuming a same structure for all the ramp generators 104_0, 104_1, . . . , 104_n, irrespective of the index j=0, . . . , n.

Notionally, either one of the ramp signals could be compared sequentially with the voltages $V_{IN\_PLUS}$ and $V_{IN\_MINUS}$.

When using double-ramp generators, the voltage at the node 1046 may be compared with the voltage at the node 1048, that is the voltage at the node 1048 may be used as reference voltage for the voltage 1046, thereby avoiding a sequential comparison of the ramp signal. It will be otherwise appreciated that the description provided herein in connection with differential input signals $V_{IN\_PLUS}$ and $V_{IN\_MINUS}$ will essentially apply also to single-ended arrangements by assuming $V_{IN\_MINUS}$=GND.

In the exemplary embodiment considered in FIG. 9, a logic synchronization block 1040 is provided configured to receive the signals preset and SOC from the control block 108 plus a signal ramp_stop as feedback and produce an initialization signal INIT plus signals SW and SW(neg) to control various switches to implement operation as described hereunder.

In one or more embodiments, the circuit of the exemplary embodiment considered in FIG. 9 may essentially implement (in a simplified manner) the ADC conversion operation of the solution disclosed in United States Patent Application Publication No. 2019/0372579, where, in response to an initialization signal INIT, the initial voltage at the nodes 1046 and 1048 can be set:

to the voltages $V_{IN\_PLUS}$ and $V_{IN\_MINUS}$, respectively (to perform analog-to-digital conversion, a considered herein), or to a first reference voltage, e.g. a supply voltage $V_{DD}$ and to a second reference voltage, e.g. ground GND, respectively (to perform digital-to-analog conversion).

In this latter respect, in the exemplary embodiment shown in FIG. 9, the first voltage signal $V_{RAMP\_PLUS}$ can be set to the first reference voltage via an electronic switch S4 made conductive by the signal INIT to couple the node 1046 to the first reference voltage $V_{DD}$, and the second voltage signal $V_{RAMP\_PINUS}$ is set to the second reference voltage via a further electronic switch S5 made conductive by the signal INIT to couple the node 1048 to the first reference voltage (here GND).

For example, in the embodiment considered (with the generators 104_0 to 104_n assumed to be identical for simplicity) the ramp generator 104_j (j=0, . . . , n) comprises a capacitor C1 coupled (e.g., directly) between the first reference voltage $V_{DD}$ and the node 1046.

Moreover, a current source 1052 is coupled selectively (in response to the signal SW) via an electronic switch S2 between the node 1046 and the second reference voltage (here, GND).

Accordingly, once the switch S2 is closed via the signal SW, the current source 1052 discharges the capacitor C1, thereby decreasing the voltage $V_{RAMP\_PLUS}$ at the node 1046.

In a complementary manner, the ramp generator 104_j (j=0, n) may comprise a capacitor C0 coupled (e.g., directly) between the second reference voltage GND and the node 1048. Moreover, a current source 1050 may be connected selectively (in response to the signal SW) via an electronic switch S3 between the node 1048 and the first reference voltage (here $V_{DD}$).

Accordingly, once the switch S3 is closed via the signal SW, the current source 1050 charges the capacitor C0, thereby increasing the voltage $V_{RAMP\_MINUS}$ at the node 1048.

That is, in the exemplary embodiment in FIG. 9, once ramp generation is started in response to the signal SW (which is generated as a result of SOC being generated):

the first voltage ramp signal $V_{RAMP\_PLUS}$ is decreased (essentially linearly), and the second voltage ramp signal $V_{RAMP\_MINUS}$ is increased (essentially linearly).

In one or more embodiments, the ramp generator 104_j (j=0, n) 204 may also comprise recirculation switches S0 and S1, which are made conductive by SW(neg) to couple the current source 1050 and the current source 1052 between the first and the second reference voltages (here $V_{DD}$ and GND), respectively, when the signal SW is not set.

In various embodiments as exemplified in FIG. 9, the nodes 1046 and 1048 are coupled to the input terminals of a comparator 1042 (a voltage differential amplifier, for instance) which provides an output (voltage) signal COMP by comparing the signal $V_{RAMP\_PLUS}$ and the $V_{RAMP\_MINUS}$ at the nodes 1046 and 1048.

Figure 10:
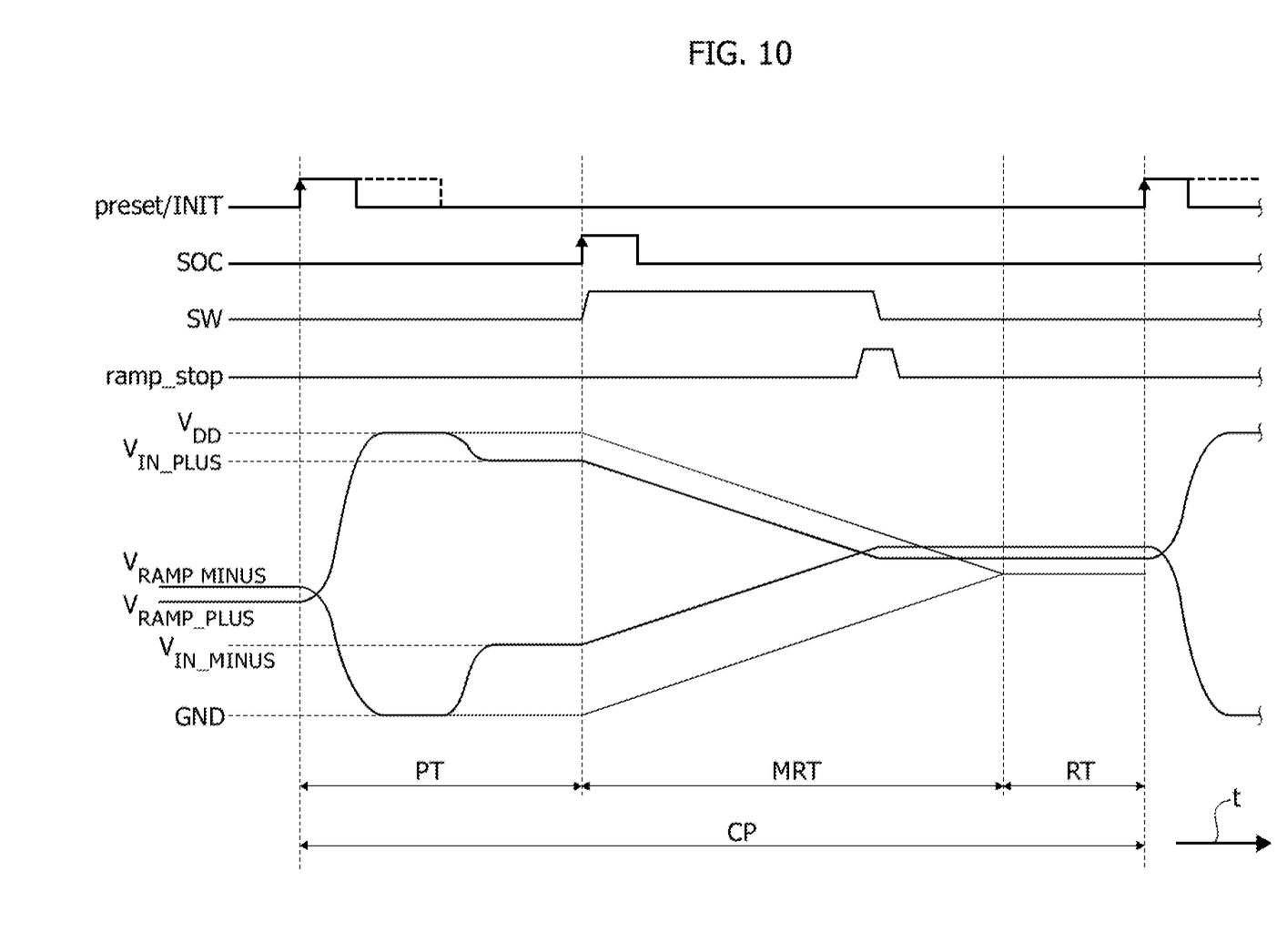
FIG. 10 is a collection of time diagrams over a common time scale exemplary of signals which may occur in embodiments.

Possible operation of the exemplary embodiment considered herein is represented over a common (abscissa) time scale t in the set of diagrams of FIG. 10. These diagrams are exemplary of possible time behaviors of the following signals (from top to bottom):
preset/INIT
SOC
SW
ramp_stop (for the j-th ramp generator)
$V_{RAMP\_PLUS}$ and $V_{RAMP\_MINUS}$.

The diagrams of FIG. 10 are exemplary of a (single) conversion period CP including:
a preset time PT where the signals $V_{RAMP\_PLUS}$ and $V_{RAMP\_MINUS}$ are first brought to $V_{DD}$ and GND and then to $V_{IN\_PLUS}$ and $V_{IN\_MINUS}$, respectively;
a (maximum) ramp time MRT where the signals $V_{RAMP\_PLUS}$ and $V_{RAMP\_MINUS}$ decrease and increase as discussed previously; and
a final register time RT.

In the exemplary embodiment considered, the output from the (analog) comparator 1042 changes when the voltages $V_{RAMP\_PLUS}$ and $V_{RAMP\_MINUS}$ correspond, that is as a result of the voltage difference between the nodes 1046 and 1048 becoming zero (or similarly when the voltage $V_{RAMP\_PLUS}$ is smaller than the voltage $V_{RAMP\_MINUS}$).

Accordingly, the output COMP from the comparator 1042 may be used to signal the end of the A/D conversion, that is in order to facilitate issue of a ramp_stop signal ramp_stop (see ramp_stop_0, ramp_stop_1, . . . , ramp_stop_n in FIG. 8) as a result of a change in the output from the comparator 1042 induced by the correspondence of the voltages $V_{RAMP\_PLUS}$ and $V_{RAMP\_MINUS}$.

In the exemplary embodiment considered, the interval or duration between the time the signal SOC (that is SW) is asserted (rising edge, for instance) and the time the ramp_stop signal (ramp_stop_0, ramp_stop_1, . . . , ramp_stop_n) is issued (rising edge, for instance) will thus represent a conversion time signal which is a function (proportional, for instance) to the value of the input voltage VIN_j (j=0, . . . , n), that is the analog signal to be converted.

For example, in the embodiment exemplified in FIG. 9, issue of the ramp stop signal may occur via an AND gate 1060, which combines the signal COMP at the output of the comparator 1042 and the signal SW, so that the signal SW performs a sort of "gating" action for COMP, enabling transfer of COMP as ramp_stop as long as ramp generation ($V_{RAMP\_PLUS}$, $V_{RAMP\_MINUS}$) is active.

In various embodiments, the control signals INIT and SW can be generated by the logic synchronization block 1040 as a function of the control signals preset and SOC (provided by the control circuit 108) and ramp_stop (provided as feedback).

It will be otherwise appreciated that representing the logic synchronization block 1040 as a distinct entity associated with the (individual) ramp converter 104_j is merely for the sake of explanation insofar as a logic synchronization feature 1040 for all the converters 104_0, . . . , 104_n may also be integrated in the control block or circuit 108.

As discussed, the control circuit 108 may be configured to generate:
a preset signal (designated "preset" in the figures), which may be used to initialize the TDC circuit 102 and the converters (ramp generators) 104_0, . . . , 104_n,
a start-of-conversion signal SOC, which indicates to the TDC circuit 102 and the converters (ramp generators) 104_0, . . . , 104_n that a new conversion should be started, and
a stop signal which indicates to the TDC circuit 102 and the converters (ramp generators) 104_0, . . . , 104_n that a certain conversion period can be stopped (see CP in FIG. 10).

Accordingly, in an embodiment as exemplified in FIG. 9, the control circuit 1040 may set the signal INIT in response to the preset signal from the control block 108, thereby setting in each converter (ramp generators) 104_0, . . . , 104_n initial voltages at the nodes 1046 and 1048 at respective voltages $V_{IN\_PLUS}$ and $V_{IN\_MINUS}$ corresponding to the (analog) input voltage VIN_0, VIN_1, . . . , VIN_n to be converted therein.

In response to the start-of-conversion signal SOC, the control circuit 1040 may set the signal SW, thereby starting the generation of the ramp signals $V_{RAMP\_PLUS}$ and $V_{RAMP\_MINUS}$ at the nodes 1046 and 1048 of the various ramp generators 104_0, . . . , 104_n.

Analog-to-digital conversion in each converter 104_0, . . . , 104_n will be completed with issue of a respective ramp_stop signal ramp_stop_0, ramp_stop_1, . . . , ramp_stop_n whose time separation (rising edge-to-rising edge, for instance) to the start-of-conversion signal SOC (common to all converters 104_0, 104_1, . . . , 104_n to produce generation of SW therein) will represent a conversion time signals indicative of the value of the respective (analog) input voltage VIN_0, VIN_1, . . . , VIN_n converted to digital.

The signal COUT (as exemplified in FIG. 3, this may include MSB as derived from RINGOUT in 102c—and possibly an associated additional synchronous coarse counter fed with CARRY in FIG. 3 plus LSB derived at 102d from the STATE signal) may thus provide an accurate time measurement of the conversion time signals adapted to generate an (accurate) desired digital output in the form of digital data words DATAOUT_0, DATAOUT_1, . . . , DATAOUT_n resulting from simultaneous analog-to-digital conversion of VIN_0, VIN_1, . . . , VIN_n.

As exemplified in FIG. 8 (by referring for simplicity to the RINGOUT and STATE signals), in one or more embodiments, of the signal COUT from the TDC circuit 102 may be applied to a set of state encoder and register blocks 110_0, 110_1, . . . , 110_n which also receive respective ramp_stop signals (that is, conversion time signals) ramp_stop_0, ramp_stop_1, . . . , ramp_stop_n from the various converters 104_0, 104_1, . . . , 104_n).

As discussed, the signal COUT from the TDC circuit 102 will include:
a set of most significant bits, MSB as derived from RINGOUT by the (4-bit, for instance) asynchronous counter in FIG. 3, possibly in conjunction with a coarse synchronous counter fed with CARRY: as noted, a single counter designated 102c is shown in FIG. 8 for the sake of simplicity;
the STATE information related to the least significant bits, LSB which may be obtained via encoding, via a 4-bit encoder as 102d, for instance.

In that way, the TDC circuit 102 facilitates converting the analog-to-digital conversion information carried by time conversion signals represented by the respective ramp stop signals ramp_stop_0, ramp_stop_1, ..., ramp_stop_n (that is, the duration of the time intervals between SOC and each one of ramp_stop_0, ramp_stop_1, ..., ramp_stop_n into digital signals DATAOUT_0, DATAOUT_1, ..., DATAOUT_n having values corresponding (proportional) to the duration the time intervals.

As noted, a same result might (notionally) be pursued by associating to each converter 104_0, 104_1, ..., 104_n a respective timer circuit, which would be disadvantageous in terms of space (semiconductor area).

As discussed herein, this disadvantage can be overcome by using a single TDC-based timer circuit 102 serving all the converters 104_0, 104_1, ..., 104_n.

The semiconductor area occupied by the multiple-input converter device 100 is also (significantly) reduced in comparison to conventional arrangements including multiple separate analog-to-digital converters.

Also, such a timer circuit could be notionally implemented with a digital timer circuit driven by the clock signal CLK of the control circuit 108. This would entail the disadvantage of a low-resolution A/D conversion, unless a clock signal CLK with a (very) high frequency is used.

These disadvantages can be overcome by using the TDC-based timer circuit 102 as discussed in the foregoing, which facilitates achieving an adequate resolution in A/D conversion without involving a high-frequency clock CLK.

In that way, in one or more embodiments, a matrix 104 of ramp generators as exemplified herein may be used comprising n+1 double ramp generator blocks (with embedded S/H circuits such as 1056 and 1058 in FIG. 9, for instance). Each block may be configured to implement a voltage-to-time conversion of a respective the input analog voltage VIN_0 to VIN_n, with the capability of issuing a corresponding time conversion signals ramp_stop_0, ramp_stop_1, ..., ramp_stop_n resulting from such voltage-to-time conversion.

That is, the double ramp generator blocks 104_0, 104_1, ..., 104_n can be configured to convert the respective input voltages VIN_0, VIN_1, ..., VIN_n (precharged therein) into time intervals or durations between the rising edge of the (common) start-of-conversion signal SOC and the rising edges of the respective ramp_stop signal, namely ramp_stop_0, ramp_stop_1, ..., ramp_stop_n, which are a function of (proportional to, for instance) the respective input voltage VIN_0, VIN_1, ..., VIN_n.

Corresponding output signals DATA_0, DATA_1, ..., DATA_n converted into digital are thus available at the outputs of the blocks 110_0, 110_1, ..., 110_n with the advantage that, due to operation of the various generators 104_0, 104_1, ..., 104_n being controlled by a single TDC 102, mismatch among the various conversion actions due to process variations and control loop timing is reduced.

As noted, references 110_0, 110_1, ..., 110_n are exemplary of state encoder and register blocks configured to store the data for a respective converter 104_0, 104_1, ..., 104_n synchronized with the rising edge of the ramp stop signal ramp_stop_0, ramp_stop_1, ..., ramp_stop_n.

Figure 11:
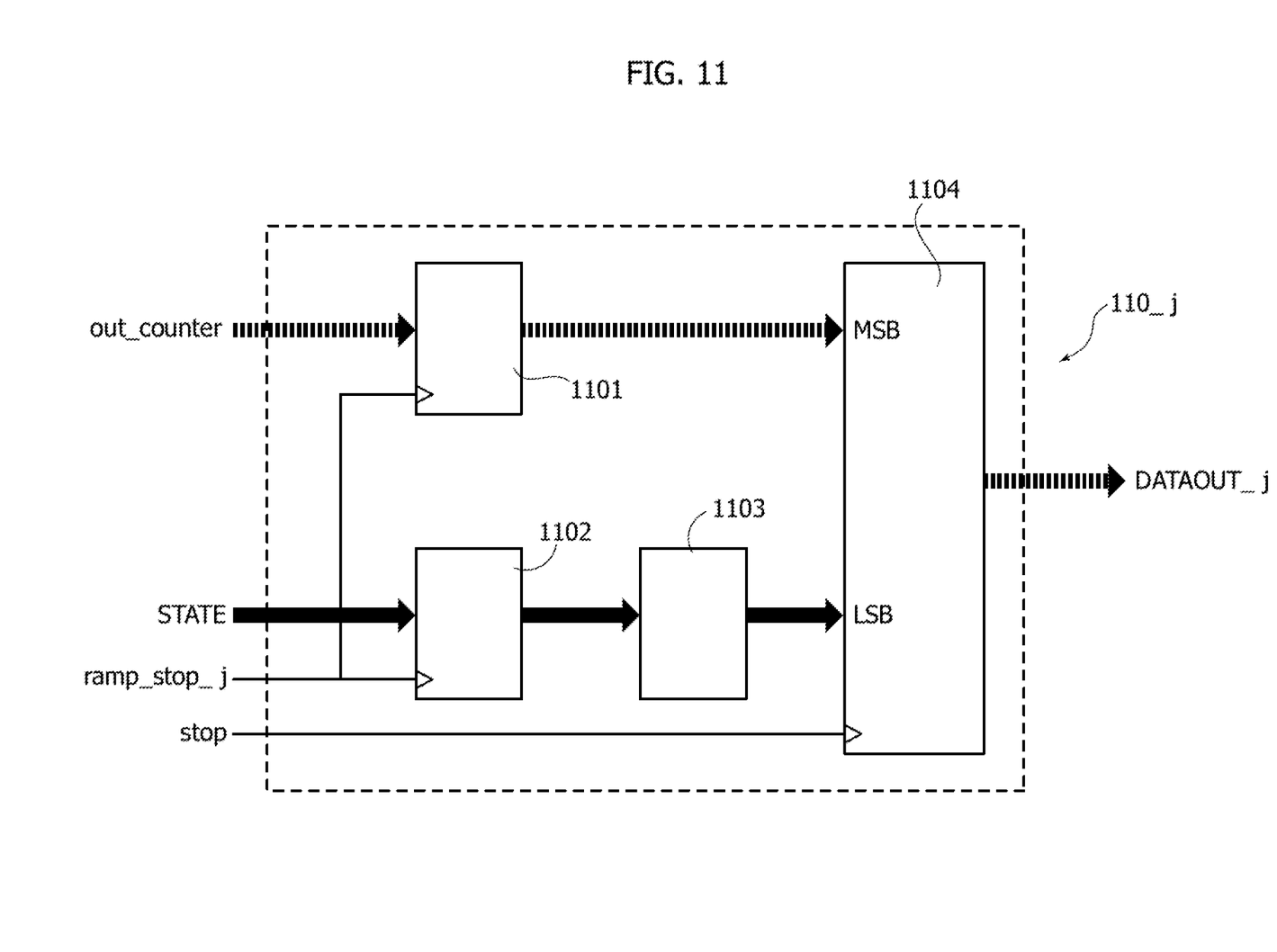
FIG. 11 is a block diagram exemplary of a possible implementation of certain parts of FIG. 8.

The block diagram of FIG. 11 is exemplary of a possible implementation of the blocks 110_0, 110_1, ..., 110n (generically indicated 110_j in FIG. 11, with j=0, ..., n).

As exemplified in FIG. 11, each of the blocks 110_j may comprise:
   a MSB register 1101 configured to receive the signal out_counter as derived from RINGOUT from the time counter (ring oscillator) via the 4-bit asynchronous counter plus possibly a coarse synchronous counter (see 102b and 102c in FIG. 8, for instance);
   a STATE register 1102 configured to receive the STATE information from the time counter (ring oscillator) 102b as well as the ramp_stop_j signal from the the j-th ramp generator 104_j;
   an encoding block 1103 coupled to the output of the STATE register 1102; and
   a DATAOUT register 1104 configured to produce a respective DATAOUT_j signal by combining the most significant bits MSB from the MSB register 1101 and the least significant bits LSB (providing a desired "refined" value for the DATAOUT_j signal) from the encoding block 1103.

As exemplified in FIG. 11, each of the blocks 110_j may also be configured to receive the stop signal from the control block 108.

In one or more embodiments, the fact that the blocks 110_0, 110_1, ..., 110_n may include the LSB encoding logic represented by the block 1103 (see also 102d in FIG. 3) distributed in a register block, for instance, may facilitate avoiding the storage of undesired values due to line propagation delays.

A device as exemplified herein (for instance, 100) may comprise:
   a plurality of input nodes configured to receive respective analog input signals (for instance, VIN_0, VIN_1, ..., VIN_n),
   a plurality of output nodes configured to provide respective digital output signals (for instance, DATA_0, DATA_1, ..., DATA_n),
   a plurality of analog-to-digital converter circuits (for instance, 104_0, 110_0; 104_1, 110_1; ...; 104_n, 110_n) arranged intermediate the input nodes of said plurality of input nodes and the output nodes of said plurality of output nodes, the analog-to-digital converter circuits of said plurality of analog-to-digital converter circuits operable over respective conversion times (for instance, the times or durations from SOC to ramp_stop_0, ramp_stop_1, ..., ramp_stop_n) to provide simultaneous conversion of said analog input signals into respective conversion time signals (for instance, ramp_stop_0, ramp_stop_1, ..., ramp_stop_n as input to the blocks 110_0, 110_1, ..., 110_n in FIG. 8),
   a time-to-digital converter circuit (for instance, 102) comprising timer circuitry (for instance, 102b, RINGOUT, out_counter, STATE) common to the analog-to-digital converter circuits of said plurality of analog-to-digital converter circuits, said timer circuitry configured to co-operate with the analog-to-digital converter circuits (for instance, with the blocks 110_0, 110_1, ..., 110_n) of said plurality of analog-to-digital converter circuits to convert said respective conversion time signals into said respective digital output signals.

In a device as exemplified herein, the analog-to-digital converter circuits of said plurality of analog-to-digital converter circuits may comprise:
   converter stages (for instance, 104_0, 104_1, ..., 104_n) configured to convert said analog input signals into respective conversion time signals, wherein said conversion time signals are a function of the values of said respective analog input signals,
   time signal processor stages (for instance, 110_0, 110_1, ..., 110_n) coupled to converter stages of said plurality of converter stages to receive therefrom said conversion time signals, the time signal processor stages of said plurality time signal processor stages coupled to the timer circuitry of said time-to-digital converter circuit and configured to convert said conversion time signals into said respective digital output signals as a function of a time count signal (for instance, COUT in FIG. 3) applied to said conversion time signals.

In a device as exemplified herein, said time signal processor stages (for instance, 110_0, 110_1, . . . , 110_n) coupled to said timer circuitry of said time-to-digital converter circuit may comprise:

counter blocks (for instance, 1101) configured to receive a first portion (for instance, out_counter) of said time count signal, said first portion of said time count signal providing the most significant bits (for instance, MSB in FIG. 11) of said respective digital output signals, state circuitry (for instance, 1102, 1103) configured to receive a second portion (for instance, STATE) of said time count signal as well as said conversion time signals (for instance, ramp_stop_0, ramp_stop_1, . . . , ramp_stop_n), said state circuitry configured to provide the least significant bits (for instance, LSB in FIG. 11) of said respective digital output signals.

In a device as exemplified herein, said timer circuitry of said time-to-digital converter circuit may comprise a ring oscillator (for instance, 102b: see also FIG. 5) having a plurality of elementary units (for instance, DE) coupled together to form a ring of elementary units, wherein said ring oscillator (102b) is configured to provide count signals (for instance, RINGOUT) and state signals (for instance, STATE) to provide said first portion and said second portion of said time count signal.

In a device as exemplified herein, the analog-to-digital converter circuits of said plurality of analog-to-digital converter circuits may comprise ramp converter stages (for instance, 104_0, 104_1, . . . , 104_n) configured to produce said conversion time signals (for instance, ramp_stop_0, ramp_stop_1, . . . , ramp_stop_n) as a function of the time taken by at least one ramp signal (for instance, $V_{RAMP\_PLUS}$, $V_{RAMP\_MINUS}$) to reach a ramp stop level (for instance, 1042) from a start-of-conversion signal (for instance, SOC, SW) is set.

In a device as exemplified herein, the analog-to-digital converter circuits of said plurality of analog-to-digital converter circuits may comprise double-ramp generators configured to generate first and second, decreasing resp. increasing, ramp signals (for instance, $V_{RAMP\_PLUS}$, $V_{RAMP\_MINUS}$) and produce said conversion time signals as a function of the time taken by said first and second ramp signals to reach respective ramp stop levels (for instance, 1042), said respective ramp stop levels optionally identical to each other.

As exemplified herein, a method of converting analog input signals (VIN_0, VIN_1, . . . , VIN_n) into respective digital output signals (DATA_0, DATA_1, . . . , DATA_n) may comprise:

operating a plurality of analog-to-digital converter circuits (for instance, 104_0, 110_0; 104_1, 110_1; . . . ; 104_n, 110_n) over respective conversion times to provide simultaneous conversion of said analog input signals into respective conversion time signals (for instance, ramp_stop_0, ramp_stop_1, . . . , ramp_stop_n), providing a time-to-digital converter circuit (for instance, 102) comprising timer circuitry (for instance, 102b, RINGOUT, out_counter, STATE) common to the analog-to-digital converter circuits of said plurality of analog-to-digital converter circuits and operating said timer circuitry together with the analog-to-digital converter circuits (for instance, by co-operating with 110_0, 110_1, . . . , 110_n as discussed) of said plurality of analog-to-digital converter circuits to convert said respective conversion time signals into said respective digital output signals.

Without prejudice to the underlying principles, the details and embodiments may vary, even significantly, with respect to what has been described by way of example only, without departing from the scope of the embodiments.

The claims are an integral part of the technical disclosure of the invention as provided herein.

The extent of protection is determined by the annexed claims.

The invention claimed is:

1. A device, comprising:
a plurality of input nodes configured to receive respective analog input signals;
a plurality of output nodes configured to provide respective digital output signals;
a plurality of analog-to-digital converter circuits arranged between the input nodes of said plurality of input nodes and the output nodes of said plurality of output nodes, wherein the analog-to-digital converter circuits of said plurality of analog-to-digital converter circuits are configured to operate over respective conversion times to provide simultaneous conversion of said analog input signals into respective conversion time signals; and
a time-to-digital converter circuit comprising timer circuitry common to the analog-to-digital converter circuits of said plurality of analog-to-digital converter circuits, said timer circuitry configured to cooperate with the analog-to-digital converter circuits of said plurality of analog-to-digital converter circuits to convert said respective conversion time signals into said respective digital output signals;
wherein each analog-to-digital converter circuit comprises:
a sampling circuit configured to sample the analog input signal and generate a sampled voltage;
a ramp circuit configured to generate a ramping signal voltage starting from the sampled voltage; and
a comparator circuit configured to perform a comparison of the ramping signal voltage to a reference and assert said conversion time signal in response to the comparison.

2. A device, comprising:
a plurality of input nodes configured to receive respective analog input signals;
a plurality of output nodes configured to provide respective digital output signals;
a plurality of analog-to-digital converter circuits arranged between the input nodes of said plurality of input nodes and the output nodes of said plurality of output nodes, wherein the analog-to-digital converter circuits of said plurality of analog-to-digital converter circuits are configured to operate over respective conversion times to provide simultaneous conversion of said analog input signals into respective conversion time signals; and
a time-to-digital converter circuit comprising timer circuitry common to the analog-to-digital converter circuits of said plurality of analog-to-digital converter circuits, said timer circuitry configured to cooperate with the analog-to-digital converter circuits of said plurality of analog-to-digital converter circuits to convert said respective conversion time signals into said respective digital output signals;

wherein the analog-to-digital converter circuits of said plurality of analog-to-digital converter circuits comprise:
   converter stages configured to convert said analog input signals into respective conversion time signals, wherein said conversion time signals are a function of values of said respective analog input signals; and
   a plurality of time signal processor stages coupled to converter stages of said plurality of converter stages to receive therefrom said conversion time signals, the time signal processor stages of said plurality of time signal processor stages coupled to the timer circuitry of said time-to-digital converter circuit and configured to convert said conversion time signals into said respective digital output signals as a function of a time count signal applied to said conversion time signals.

3. The device of claim 2, wherein said time signal processor stages comprise:
   counter blocks configured to receive a first portion of said time count signal, said first portion of said time count signal providing most significant bits of said respective digital output signals; and
   state circuitry configured to receive a second portion of said time count signal as well as said conversion time signals, said state circuitry configured to provide least significant bits of said respective digital output signals.

4. The device of claim 3, wherein said timer circuitry of said time-to-digital converter circuit comprises a ring oscillator having a plurality of elementary units coupled together to form a ring of elementary units, wherein said ring oscillator is configured to provide count signals and state signals respectively providing said first portion and said second portion of said time count signal.

5. A device, comprising:
a plurality of input nodes configured to receive respective analog input signals;
a plurality of output nodes configured to provide respective digital output signals;
a plurality of analog-to-digital converter circuits arranged between the input nodes of said plurality of input nodes and the output nodes of said plurality of output nodes, wherein the analog-to-digital converter circuits of said plurality of analog-to-digital converter circuits are configured to operate over respective conversion times to provide simultaneous conversion of said analog input signals into respective conversion time signals; and
a time-to-digital converter circuit comprising timer circuitry common to the analog-to-digital converter circuits of said plurality of analog-to-digital converter circuits, said timer circuitry configured to cooperate with the analog-to-digital converter circuits of said plurality of analog-to-digital converter circuits to convert said respective conversion time signals into said respective digital output signals;
wherein the analog-to-digital converter circuits of said plurality of analog-to-digital converter circuits comprise ramp converter stages configured to produce said conversion time signals as a function of a time taken by at least one ramp signal to reach a ramp stop level from when a start-of-conversion signal is set.

6. A device, comprising:
a plurality of input nodes configured to receive respective analog input signals;
a plurality of output nodes configured to provide respective digital output signals;
a plurality of analog-to-digital converter circuits arranged between the input nodes of said plurality of input nodes and the output nodes of said plurality of output nodes, wherein the analog-to-digital converter circuits of said plurality of analog-to-digital converter circuits are configured to operate over respective conversion times to provide simultaneous conversion of said analog input signals into respective conversion time signals; and
a time-to-digital converter circuit comprising timer circuitry common to the analog-to-digital converter circuits of said plurality of analog-to-digital converter circuits, said timer circuitry configured to cooperate with the analog-to-digital converter circuits of said plurality of analog-to-digital converter circuits to convert said respective conversion time signals into said respective digital output signals;
wherein the analog-to-digital converter circuits of said plurality of analog-to-digital converter circuits comprise double-ramp generators configured to respectively generate a first decreasing ramp signal and a second increasing ramp signal and produce said conversion time signals as a function of a time taken by said first and second ramp signals to reach respective ramp stop levels.

7. The device of claim 6, wherein said respective ramp stop levels are identical to each other.

8. A device, comprising:
a plurality of input nodes configured to receive respective analog input signals;
a plurality of output nodes configured to provide respective digital output signals;
an oscillator circuit having a plurality of states and configured to output a clock signal;
an asynchronous counter configured to count said clock signal to generate a count value;
a plurality of analog-to-digital converter circuits coupled to the input nodes of said plurality of input nodes, wherein the analog-to-digital converter circuits of said plurality of analog-to-digital converter circuits are configured to generate a stop signal dependent on an analog signal at the input node;
a plurality of digital processing circuits coupled to receive the stop signals from the plurality of analog-to-digital converter circuits, wherein each digital processing circuit includes:
   a first latch configured to latch the count value from the asynchronous counter in response to assertion of the stop signal to provide a most significant bit portion;
   a second latch configured to latch values of certain ones of the plurality states of the oscillator circuit in response to assertion of the stop signal;
   an encoder circuit configured to encode said latched values of certain ones of the plurality states of the oscillator circuit to generate a least significant bit portion; and
   an output register configured to generate the digital output signal representing said analog signal using the most significant bit portion and the least significant bit portion.

9. The device of claim 8, wherein said oscillator circuit is a ring oscillator having a plurality of elementary units coupled together to form a ring of elementary units, wherein outputs of certain ones of the elementary units provide said certain ones of the plurality states.

10. The device of claim 8, wherein each analog-to-digital converter circuit comprise a ramp converter stage configured to produce said stop signals as a function of a time taken by at least one ramp signal to reach a ramp stop level from when a start-of-conversion signal is asserted.

11. The device of claim 8, wherein each analog-to-digital converter circuit comprises double-ramp generators configured to respectively generate a first decreasing ramp signal and a second increasing ramp signal and produce said stop signal as a function of a time taken by said first and second ramp signals to reach respective ramp stop levels.

12. The device of claim 11, wherein said respective ramp stop levels are identical to each other.

13. A device, comprising:
- a plurality of input nodes configured to receive respective analog input signals;
- a plurality of output nodes configured to provide respective digital output signals;
- a plurality of analog-to-digital converter circuits arranged between the input nodes of said plurality of input nodes and the output nodes of said plurality of output nodes, wherein the analog-to-digital converter circuits of said plurality of analog-to-digital converter circuits are configured to operate over respective conversion times to provide simultaneous conversion of said analog input signals into respective conversion time signals; and
- a time-to-digital converter circuit comprising timer circuitry common to the analog-to-digital converter circuits of said plurality of analog-to-digital converter circuits, said timer circuitry configured to cooperate with the analog-to-digital converter circuits of said plurality of analog-to-digital converter circuits to convert said respective conversion time signals into said respective digital output signals;

wherein each analog-to-digital converter circuit comprises:
- a sampling circuit configured to sample differential components of the analog input signal and generate first and second sampled voltages;
- a ramp circuit configured to generate an increasing ramp signal voltage starting from said first sampled voltage and generating a decreasing ramp signal voltage starting from said second sampled voltage; and
- a comparator circuit configured to perform a comparison of the increasing ramp signal voltage to the decreasing ramp signal voltage and assert said conversion time signal in response to the comparison indicating that the increasing and decreasing ramp signal voltages are equal.

* * * * *

UNITED STATES PATENT AND TRADEMARK OFFICE
CERTIFICATE OF CORRECTION

PATENT NO. : 11,101,813 B2
APPLICATION NO. : 16/993608
DATED : August 24, 2021
INVENTOR(S) : Giovanni Sicurella et al.

Page 1 of 1

It is certified that error appears in the above-identified patent and that said Letters Patent is hereby corrected as shown below:

In the Specification

Column 5, Line 9, replace [[ 13 and 14 ]] with -- I3 and I4 --.

Signed and Sealed this
Twenty-second Day of March, 2022

Drew Hirshfeld
*Performing the Functions and Duties of the*
*Under Secretary of Commerce for Intellectual Property and*
*Director of the United States Patent and Trademark Office*